United States Patent [19]

Dobkin

[11] 4,410,839

[45] Oct. 18, 1983

[54] APPARATUS FOR CONTROLLING POWER CONSUMPTION IN LIGHTING LOADS AND THE LIKE

[75] Inventor: Robert C. Dobkin, Hillsborough, Calif.

[73] Assignee: Hybrinetics, Inc., Santa Rosa, Calif.

[21] Appl. No.: 279,775

[22] Filed: Jul. 2, 1981

[51] Int. Cl.³ .............................................. H05B 37/00
[52] U.S. Cl. .................................... 315/320; 315/210; 315/321; 315/361; 315/362; 307/141.4
[58] Field of Search ............ 307/140, 142, 141, 141.4; 315/362

[56] References Cited

U.S. PATENT DOCUMENTS

| | | | |
|---|---|---|---|
| 3,761,912 | 9/1973 | Stetiner et al. | 315/360 |
| 3,860,910 | 1/1975 | Hudson | 340/147 R |
| 4,160,192 | 7/1979 | McAllise | 315/362 |
| 4,339,696 | 7/1982 | Jabor | 307/141 |

Primary Examiner—Harold A. Dixon
Attorney, Agent, or Firm—Flehr, Hohbach, Test, Albritton & Herbert

[57] ABSTRACT

Apparatus for interrupting power to a plurality of parallel loads such as lighting circuits and selectively reapplying power to the loads includes a first switch serially interconnecting the loads to a power line. Second switch circuits are serially connected with each load whereby interruption of power to a load for a predetermined period of time opens the switch circuits. The switch circuits include bidirectional conduction devices such as triacs which require a gating signal before becoming conductive. A resistor-capacitor circuit provides a gating signal to the triac to maintain conduction thereof for the predetermined period of time.

3 Claims, 5 Drawing Figures

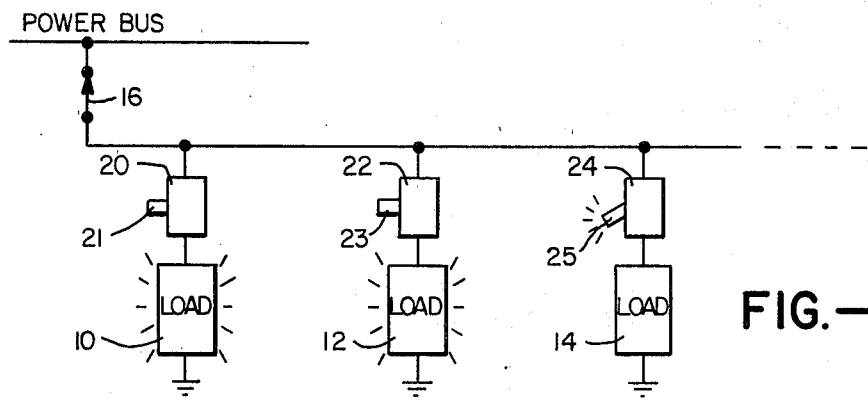
FIG.—1A
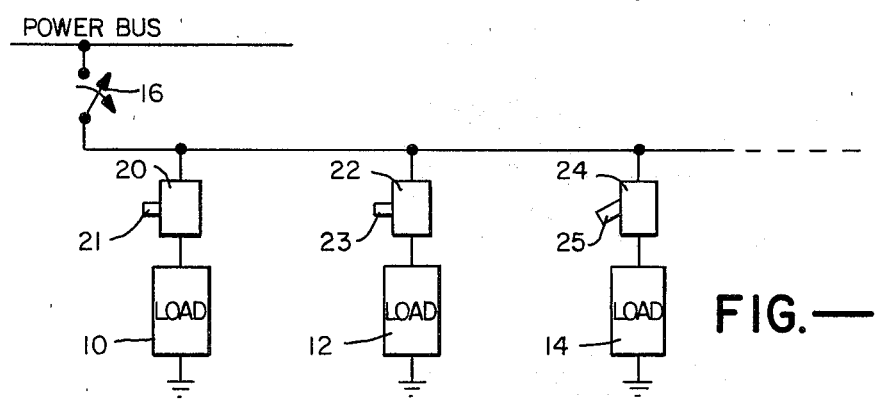
FIG.—1B
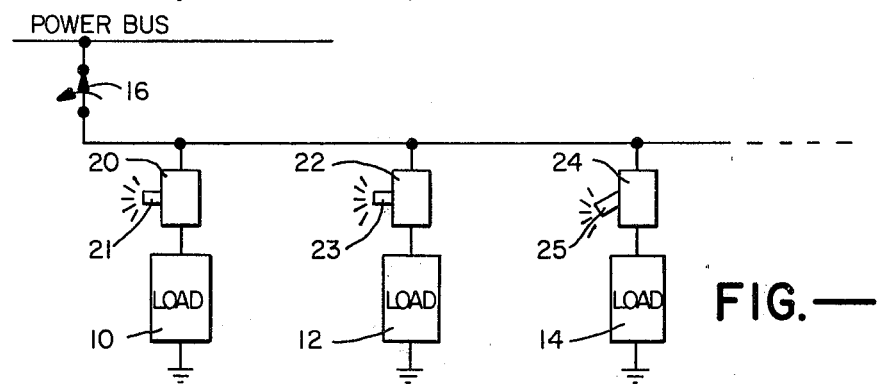
FIG.—1C
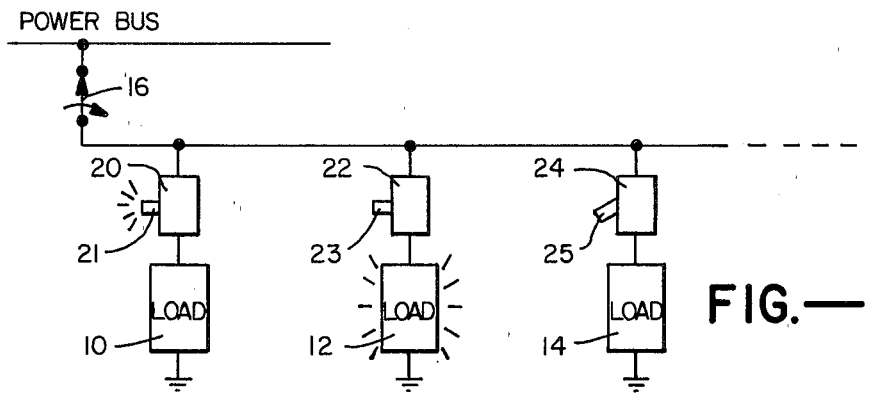
FIG.—1D

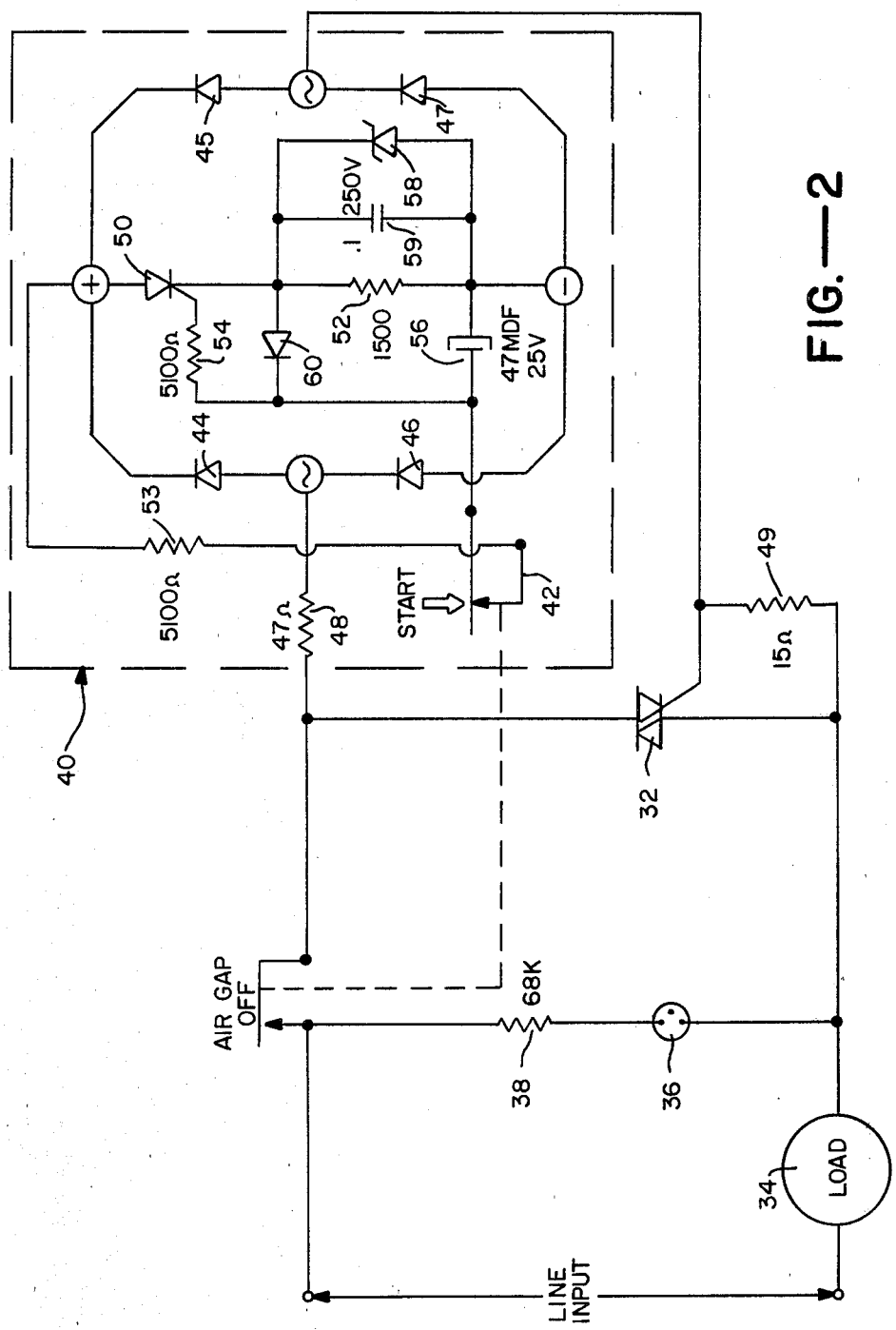
FIG.—2

APPARATUS FOR CONTROLLING POWER CONSUMPTION IN LIGHTING LOADS AND THE LIKE

This invention relates generally to apparatus for controlling electrical power consumption of voltage regulatable loads such as lighting loads in office buildings, industrial plants, schools, and other like facilities. More particularly, the invention relates to apparatus which can control power consumption in a plurality of loads and which allows selective energization of the loads.

Energy conservation is a major concern today. One effective method of conserving energy is through regulation of power consumption whereby unnecessary power usage is eliminated. Disclosed in U.S. Pat. Nos. 4,189,664 and 4,219,759 are power control units for automatically regulating power consumption in single phase and three phase loads such as lighting circuitry in accordance with load demands. For example, during daylight hours and also during cleaning at night the requisite light level drops and power consumption can be reduced by lowering the level of the voltage applied to the load. At other times when full light output is required the voltage levels are increased accordingly.

In large facilities having many lighting circuits a need exists for means for extinguishing current in all of the lighting circuits but which allows selective re-energization of the lighting circuits. For example, in a large office building which is essentially vacated after normal business hours, switch means can be provided for automatically turning off all lights. However, should any one area of the building require light output, an override switch should be provided in that area to allow the selective energization of the required lighting circuit.

Accordingly, an object of the present invention is apparatus for automatically removing power from a plurality of loads with means for thereafter allowing power application to selective loads.

Another object of the invention is control circuitry for a load which automatically interrupts a load circuit in response to a momentary removal of supply voltage and which can be selectively reset for conduction of load current.

Still another object of the invention is apparatus for automatically extinguishing current in a plurality of lighting circuits and in which selective circuits can thereafter be re-energized.

Briefly, apparatus for controlling energization of a plurality of parallel loads and allowing selective re-energization of the plurality of loads in accordance with the invention comprises first switch means serially connected with the plurality of parallel loads for removing and applying power to all of the loads. Second switch means is associated with each of the loads with each switch means including a first switch having a first position for removing power to its associated load and a second position for applying power. A second switch is serially connected with the first switch and the load, and control means is provided for the second switch whereby the second switch is opened in response to opening of the first switch or the loss of power for a predetermined period of time, and is closed in response to closing of a reset switch.

More particularly, the second switch comprises a first conduction device having a first terminal, a second terminal, and a gate terminal. Control means responsive to the reset switch applies a conductive signal to the gate terminal of the triac. The control means comprises a diode bridge connected through the first switch to receive line voltage, a second conduction device connected across the bridge to permit the conduction of current during half cycles of line voltage, and means responsive to conduction of current through the second conduction device for applying a conduction gating signal to the first conduction device. Advantageously, the reset switch can include a third position of the first switch with conductive means serially connecting the third position of the first switch to the gate electrode of the triac.

In a preferred embodiment the first conduction device comprises a triac and the second conduction device comprises a silicon controlled rectifier.

The invention and objects and features thereof will be more readily apparent from the following detailed description and appended claims when taken when the drawing, in which:

FIGS. 1A–1D are schematics illustrating the operation of apparatus in accordance with the invention.

FIG. 2 is a detailed schematic of one embodiment of the present invention.

Referring now to the drawings, FIGS. 1A–1D are functional block diagrams illustrating operation of apparatus in accordance with the present invention. A plurality of loads 10, 12, and 14 such as lighting circuits in a building are connected in parallel and through a switch means 16 to a power bus. The switch means 16 may comprise a switch in the master panel or power control units such as disclosed in U.S. Pat. Nos. 4,219,759 and 4,189,664, supra. The provision of the switch 16 serially connecting all of the loads to the power bus allows for the reduction of power or removal of power from all of the loads in response to energy curtailment or when power to the loads may no longer be required. For example, the switch 16 can be automatically controlled to remove power from all of the lighting circuits of the building at a specified hour in the evening, and to restore power to the loads at another specified time in the morning.

However, lighting may be required in certain parts of the building when the switch 16 has removed power, and provision of only the switch 16 would be impractical.

In accordance with the invention second switch means 20, 22 and 24 are serially connected with the loads 10, 12 and 14, respectively to permit the selective re-energization of the loads. Each of the switch means 20, 22, 24 includes a single pole, single gang toggle switch which may have a configuration for positioning in a standard single gang handy box or knockout box that normally houses a conventional lighting switch. Each of the toggle switches includes a manually positionable lever 21, 23, and 25 which, as will be described in more detail hereinbelow, can be moved to one of three switch positions: On, Off, and Reset.

In FIG. 1A, switch 16 is closed in normal operation and switches 20 and 22 are closed with loads 10 and 12 energized. Switch 24 is in an open position and load 14 is not energized. As will be described further hereinbelow the lever 25 is provided with a light indicating that power is available for load 14. In FIG. 1B switch 16 is opened and power is removed from the loads 10 and 12. After switch 16 has been opened for a predetermined period of time, the switch is again closed as in FIG. 1C but power is not applied to the loads 10 and 12. Light indicators incorporated in the manual levers 21 and 23 indicate that power is available at the switches.

Assuming that it is desired to re-energize the lighting load 12, lever 23 of switch means 22 is moved to a third reset position and control means reactivates the switch means for applying power to load 12, as indicated. Thus, the opening of the master switch 16 removes power from all of the loads, and power can be reapplied selectively to each of the loads by resetting the switch means serially connected with the loads.

Referring now to FIG. 2, a detailed schematic of one embodiment of the apparatus for selectively re-energizing a load is illustrated. The load circuit includes a first switch 30 and a second switch 32 serially connected with a load 34 between the A.C. power input lines. As above described, the switch 30 preferably comprises a single pole, three position switch having an on position, an off (air-gap) position, and a reset position, as will be described hereinbelow. Advantageously, a light indicator such as a lamp 36 can be positioned in the lever of switch 30 and serially connected through a resistor 38 across the input lines to indicate the presence of power at the switch. Switch 32 is a bidirectional conductive device such as a triac having an anode terminal, a cathode terminal and a control terminal.

With electrical power present, switch 30 closed, and triac 32 conducting, current will flow through the load 34. However, the removal of power or the opening of switch 30 interrupts the flow of current through load 34, and after a predetermined period of time the conduction of triac 32 is extinguished. Thereafter, upon the reapplication of power and the closing of switch 30 load current remains extinguished until the triac 32 receives a conduction signal at the gate electrode.

Control circuitry shown generally at 40 is provided to apply a conduction signal to triac 32. Preferably, switch 30 has a third reset position where the switch remains closed and also closes a mechanically coupled switch 42 in the control circuitry. The control circuitry comprises a bridge comprising diodes 44, 45, 46, and 47 which are connected across the power lines through resistors 48 and 49. A silicon controlled rectifier (SCR) 50 is serially connected with resistor 52 between the cathodes of diodes 44, 45 and the anodes of diodes 46, 47 whereby a positive voltage differential can be applied across the anode and cathode of SCR 50 during alternate half-cycles of the input line voltage.

When switch 42 is momentarily closed a positive trigger voltage is applied to the control electrode of the SCR 50 through resistor 54. The SCR is rendered conductive and a current flows through the SCR 50 and resistor 52 thereby charging a capacitor 56 connected across resistor 52 through diode 60. Zenner diode 58 and capacitor 59 are also connected in parallel with resistor 58 to limit the voltage thereacross. The charge on capacitor 56 is applied through resistor 54 to maintain the SCR 50 conductive.

Current passing through the SCR 50 is communicated through diode 47 to the gate electrode of triac 32 thereby rendering triac 32 conductive. Thereafter, triac 32 will remain conductive so long as load current passes therethrough.

Upon removal of power to switch 30, current ceases to flow through SCR 50. However, a conductive signal is maintained on the control electrode of SCR 50 by the charge on capacitor 56 for a time period determined by the time constant of capacitor 56 and resistor 52. Thus, reapplication of power to switch 30 during this time interval will permit current to flow through the SCR 50 and again apply a trigger voltage to triac 32. However, after the time interval established by resistor 52 and capacitor 56, the SCR 50 becomes nonconductive and the reapplication of power through switch 30 will not produce a current through SCR 50. Thus, a conductive signal is not reapplied to triac 32 after the predetermined time interval.

To again fire the SCR 50 the reset switch 42 which is ganged to switch 30 must again be closed by moving switch 30 to a reset position and thereby reapplying a trigger voltage through resistor 54 to the control terminal of SCR 50. Accordingly, the conduction of triac 32 is dependent on the availability of power at switch 30 and a conduction signal from the control means.

Switch apparatus in accordance with the present invention has proved to be useful in lighting applications by permitting the automatic extinction of currents in a plurality of loads while permitting selective light circuits to be re-energized. The apparatus is readily mounted in a conventional lighting switch box and is simple to install. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. Switch apparatus for selectively applying a line voltage to a load and responsive to intermittent removal of line voltage comprising a first switch having an open position, a closed position, and a reset position, a first conduction device serially connected with said first switch, said first conduction device having an electrode for receiving a conduction gating signal, said first conductive device being rendered conductive by a gating signal applied to said electrode, and conduction control means for said first conduction device, said control means including a full wave rectification bridge having two ac terminals and two dc terminals with one ac terminal connected through said first switch to receive line voltage, a second conduction device connected across said dc terminals of said bridge to permit the conduction of current, said second conduction device having a gate electrode for receiving a conduction gating signal, a second switch mechanically coupled to said first switch, said second switch normally being open and being closed by movement of said first switch to said reset position, means serially connecting said second switch between one of said terminals of said bridge and said gate electrode of said second conduction device for applying a conduction gating signal to said gate electrode, means responsive to conduction of current through said second conduction device for applying a conduction gating signal to said first conduction device, timing means for maintaining a conduction gating signal to said second conduction device for a predetermined period of time after removal of said line voltage, and conductive means for serially connecting said switch apparatus to a load.

2. Switch apparatus as defined by claim 1 wherein said first conduction device comprises a triac and said second conduction device comprises a silicon controlled rectifier.

3. Switch apparatus as defined by claim 1 wherein said timing means comprises a resistor-capacitor circuit operably connected to store a charge in response to current passing through said second conduction means, and means for applying said charge to said electrode of said second conduction means.

* * * * *